United States Patent
Chou et al.

(10) Patent No.: US 6,914,365 B1
(45) Date of Patent: Jul. 5, 2005

(54) PIEZOELECTRIC TRANSFORMATION DRIVING APPARATUS

(75) Inventors: Chin-Wen Chou, Hsin Tien (TW); Eddie Cheng, Hsin Tien (TW); Kuang-Ming Wu, Hsin Tien (TW)

(73) Assignee: Zippy Technology Corp., Hsin Tien (TW)

( * ) Notice: Subject to any disclaimer, the term of this patent is extended or adjusted under 35 U.S.C. 154(b) by 0 days.

(21) Appl. No.: 10/832,996

(22) Filed: Apr. 28, 2004

(51) Int. Cl.[7] ............................................. H01L 41/04
(52) U.S. Cl. ................................................ 310/318
(58) Field of Search ............................ 310/318, 317, 310/316, 359–358; 315/224, 209 PZ; H01L 41/107

(56) References Cited

U.S. PATENT DOCUMENTS 6,724,126 B2 * 4/2004 Chou ........................ 310/318
6,791,239 B2 * 9/2004 Chou et al. ................. 310/318
2001/0035698 A1 * 11/2001 Nakatsuka et al. ......... 310/318

* cited by examiner

Primary Examiner—Darren Schuberg
Assistant Examiner—Karen Beth Addison
(74) Attorney, Agent, or Firm—Birch, Stewart, Kolasch & Birch, LLP

(57) ABSTRACT

A piezoelectric transformation driving apparatus to drive a plurality of high voltage systems through a low voltage system includes a control unit and a driving unit to output first driving signals of the same phase and same frequency to drive a transformation unit, a plurality of piezoelectric units and loads. A ceramic transformer level driving circuit may be included to drive the transformation unit, the piezoelectric units and loads through a voltage floating level so that a medium voltage system may be controlled by a low voltage level.

11 Claims, 7 Drawing Sheets

PIEZOELECTRIC TRANSFORMATION DRIVING APPARATUS

FIELD OF THE INVENTION

The present invention relates to a piezoelectric transformation driving apparatus and particularly to piezoelectric transformation driving apparatus that drives a single transformation unit through a driving unit then transfers energy to a plurality of piezoelectric units and loads.

BACKGROUND OF THE INVENTION

At present the light source used by liquid crystal display (LCD) of desktop computers and notebook computers, PDA, and Webpad generally is a cold cathode fluorescent lamp (CCFL) driven by a driving apparatus at a high voltage. Light is projected through a back light module to a back light plate to enable users to see the displaying picture.

The earlier back light module was widely used in commercial light boxes. These days with LCD industry flourishing, and high demand of luminous and full color requirements for the non-luminous LCD, the back light module is tightly coupled with the LCD and has become an indispensable item to provide even and high intensity lighting. It is a vital element in TFT LCD products. The back light module has gone through a lot of developments and progresses, such as from direct projection and side projection in the earlier time to using the light source of CCFL, LED and EL. The optical characteristics of the back light module also are reflected in the product features such as TFT LCD or STN LCD.

LCD TV or LCD display screen with a touch film requires a greater luminosity to compensate visual requirement. Refer to FIG. 1 for a conventional driving device for driving CCFL. It has a single pulse-width modulation (PWM) control unit 11 to receive voltage output from a power unit 10 and output a control signal to drive a driving unit 12 consisting of a P-MOSFET 120 and a N-MOSFET 121. The driving unit 12 then drives a piezoelectric unit 14 (such as ceramic piezoelectric transformer) and a load 15 (such as CCFL). The CCFL is ignited at a high voltage. When the current of the lamp increases, the luminosity also increases.

As previously discussed, when the back light luminosity and evenness of the back light module are not desirable, a common practice is to use multiple lamps. In such a condition, the number of PWM control unit 11, driving unit 12 and piezoelectric unit 14 required to ignite the lamps also increases. As a result, the size of the circuit board increases. Fabrication is more difficult and cost is higher.

SUMMARY OF THE INVENTION

Therefore the primary object of the present invention is to resolve the aforesaid disadvantages. The invention provides a piezoelectric transformation driving apparatus that employs a driving unit to drive a transformation unit, a plurality of piezoelectric units and loads and aims to reduce the number of parts, shrink the circuit board, make fabrication easier and reduce the production cost.

Another object of the invention is to drive a single load synchronously through a plurality of piezoelectric units.

In one aspect, the invention employs a ceramic transformer level driving circuit to synchronously drive a single transformation unit, a plurality of piezoelectric units and loads to control a medium voltage system through a low voltage level.

The piezoelectric transformation driving apparatus according to the invention includes:

a control unit to receive low voltage input and transmit a synchronous control signal;

a driving unit to output a driving signal;

a transformation unit connecting to the driving unit and driven by the driving signal output from the driving unit;

a plurality of piezoelectric units connecting to the transformation unit and driven by signals output by the transformation unit; and a plurality of loads connecting to the piezoelectric units and driven by signals output by the piezoelectric units.

The features of the invention include: the control unit receives a low voltage input and transmits a synchronous control signal to control the driving unit, the driving unit amplifies internal signals to output a first driving signal, the transformation unit is driven by the first driving signal and converts to a second driving signal to output, the piezoelectric units are driven by the second driving signal and convert to a third driving signal to output, and the loads are driven by the third driving signal input from the piezoelectric units. Thereby the transformation unit can synchronously drive a plurality of piezoelectric units and loads.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

The piezoelectric transformation driving apparatus according to the invention employs a driving apparatus to drive CCFL at a high voltage so that light is projected to a back light plate through a back light module to enable users to see a clear picture. It also can transform a small signal through a low voltage system to a medium voltage level to drive a plurality of medium voltage or high voltage systems.

Embodiment 1

Figure 1:
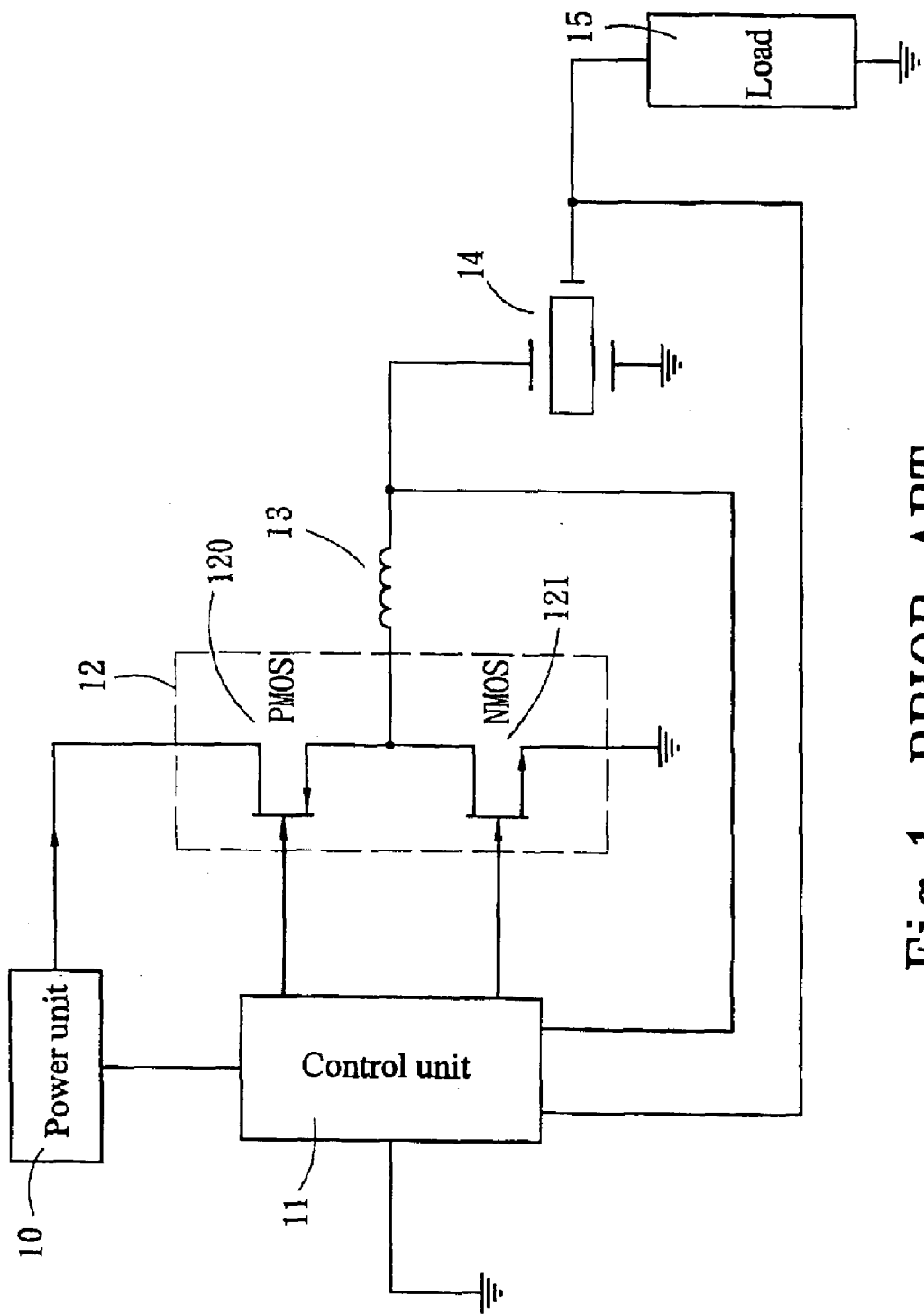
FIG. 1 is a schematic view of a conventional CCFL driving apparatus.
Figure 2:
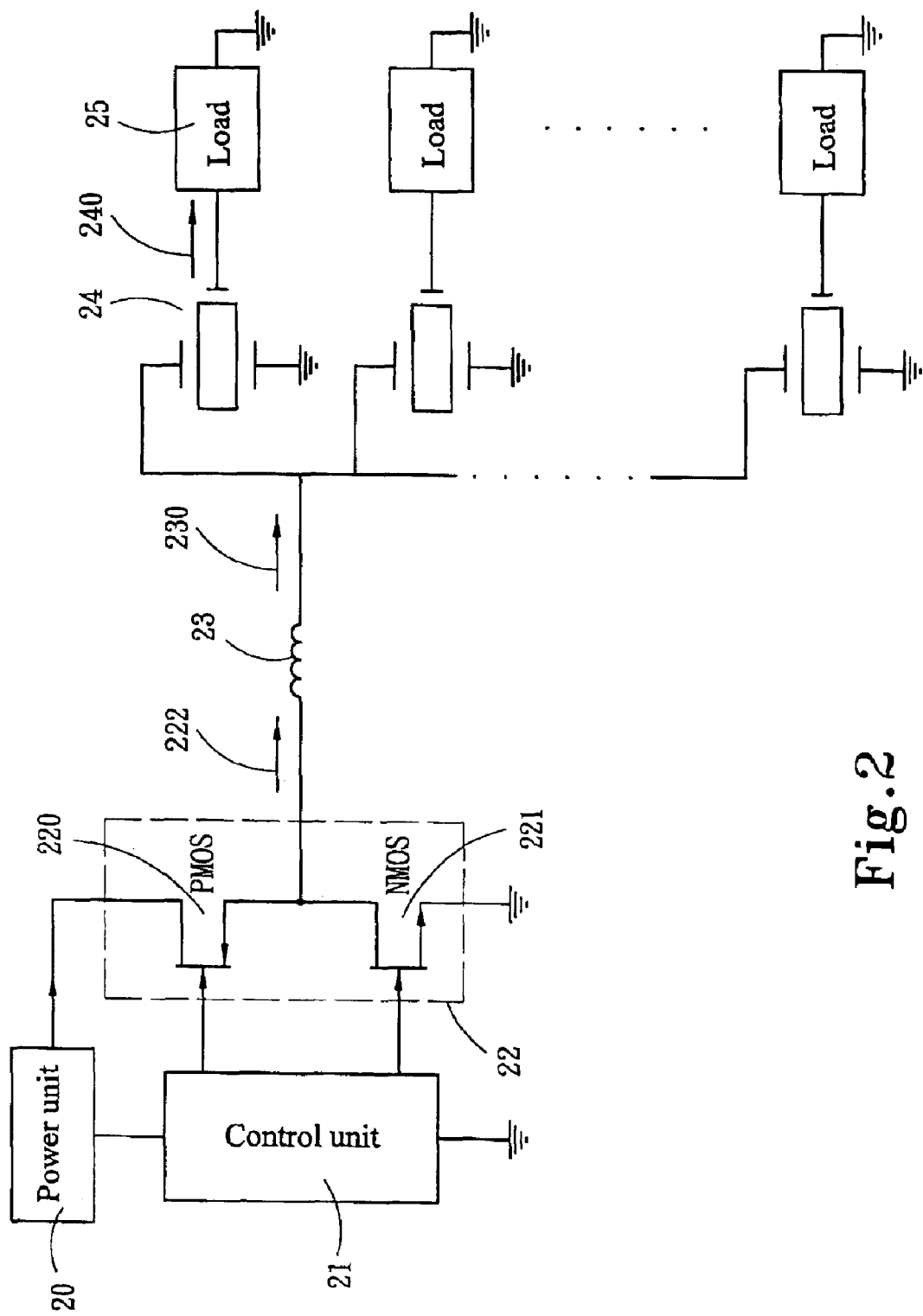
FIG. 2 is a schematic view of a first embodiment of the invention.

Refer to FIG. 2 for a first embodiment of the driving apparatus of the invention. It includes:

a control unit 21 to receive low voltage power output from a power unit 20 and transmit a synchronous control signal through PWM;

a driving unit 22 consisting of a P-MOSFET 220 and a N-MOSFET 221 to receive the control signal from the control unit 21, and through actuation of the P-MOSFET 220 and N-MOSFET 221 to amplify the internal signal and output a driving signal 222;

a transformation unit 23 being an inductor connecting to the driving unit 22 and driven by the first driving signal 222 input from the driving unit 22, and transforming to a second driving signal 230 to be output;

a plurality of piezoelectric units 24 being a single layer or laminated ceramic piezoelectric transformers connecting to the transformation unit 23 and driven by the second driving signal 230 input from the transformation unit 23, and through various polarization and polarity arrangements to transform to third driving signals 240 that have various phases to be output; and a plurality of loads 25 being CCFLs connecting to the piezoelectric units 24 and driven by the third driving signals 240 input from the piezoelectric units 24.

This embodiment includes the following features: a single PWM control unit 21 is used to send a synchronous control signal to control the driving unit 22; the driving unit 22 amplifies internal signal to output the first driving signal 222; the transformation unit 23 is driven by the first driving signal 222 and transforms to generate the second driving signal 230 to be output; a plurality of piezoelectric units 24 are driven by the second driving signal 230 and transform to generate the third driving signals 240 to be output; and a plurality of loads 25 are driven by the third driving signals 240 output from the piezoelectric units 24. Therefore a single transformation unit 23 can synchronously drive a plurality of piezoelectric units 24 and loads 25. As a result, part number required is smaller, the circuit board may be shrunk, fabrication is easier and production cost is lower.

Embodiment 2

Figure 3A:
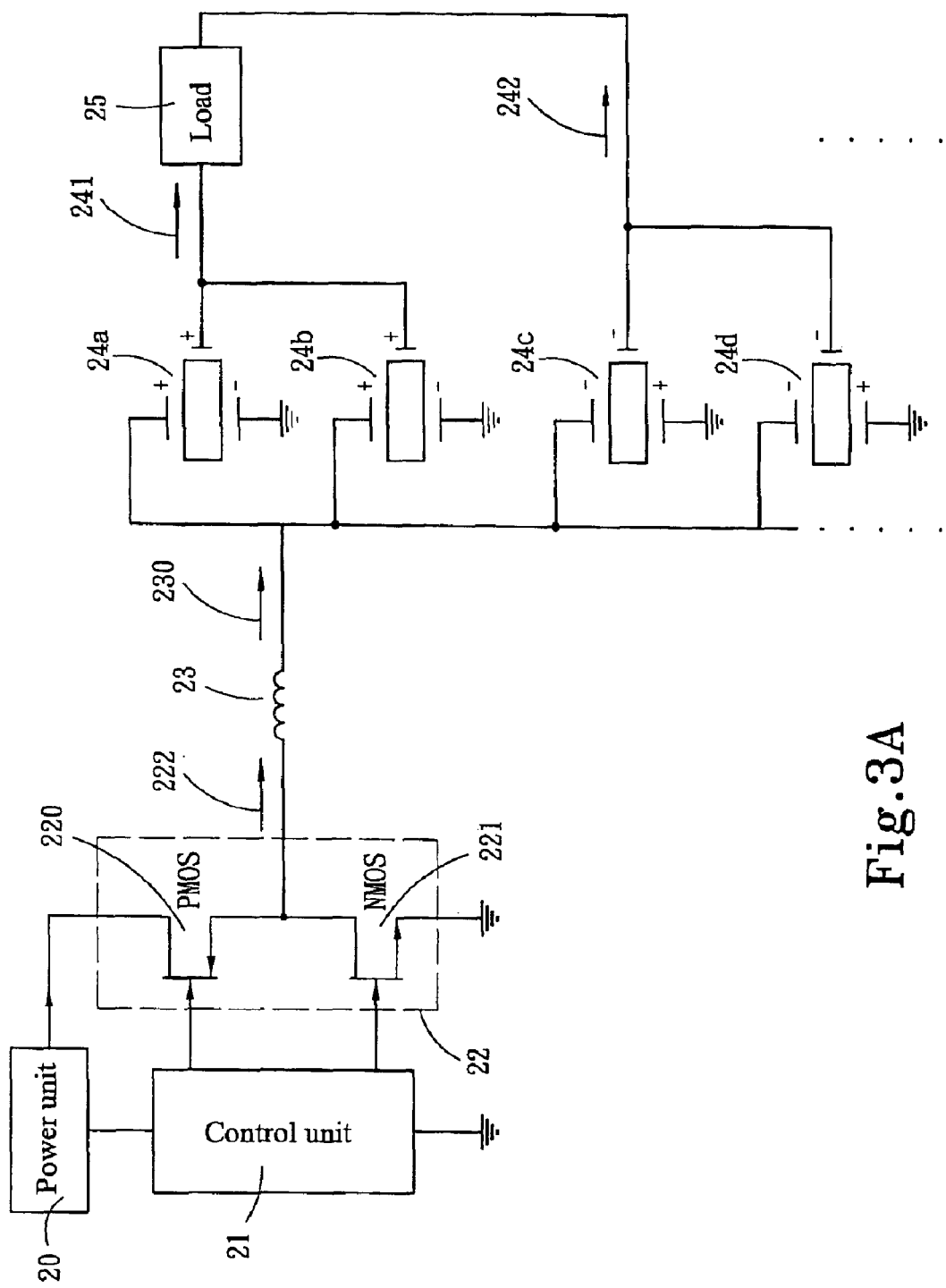
FIG. 3A is a first schematic view of a second embodiment of the invention.
Figure 3B:
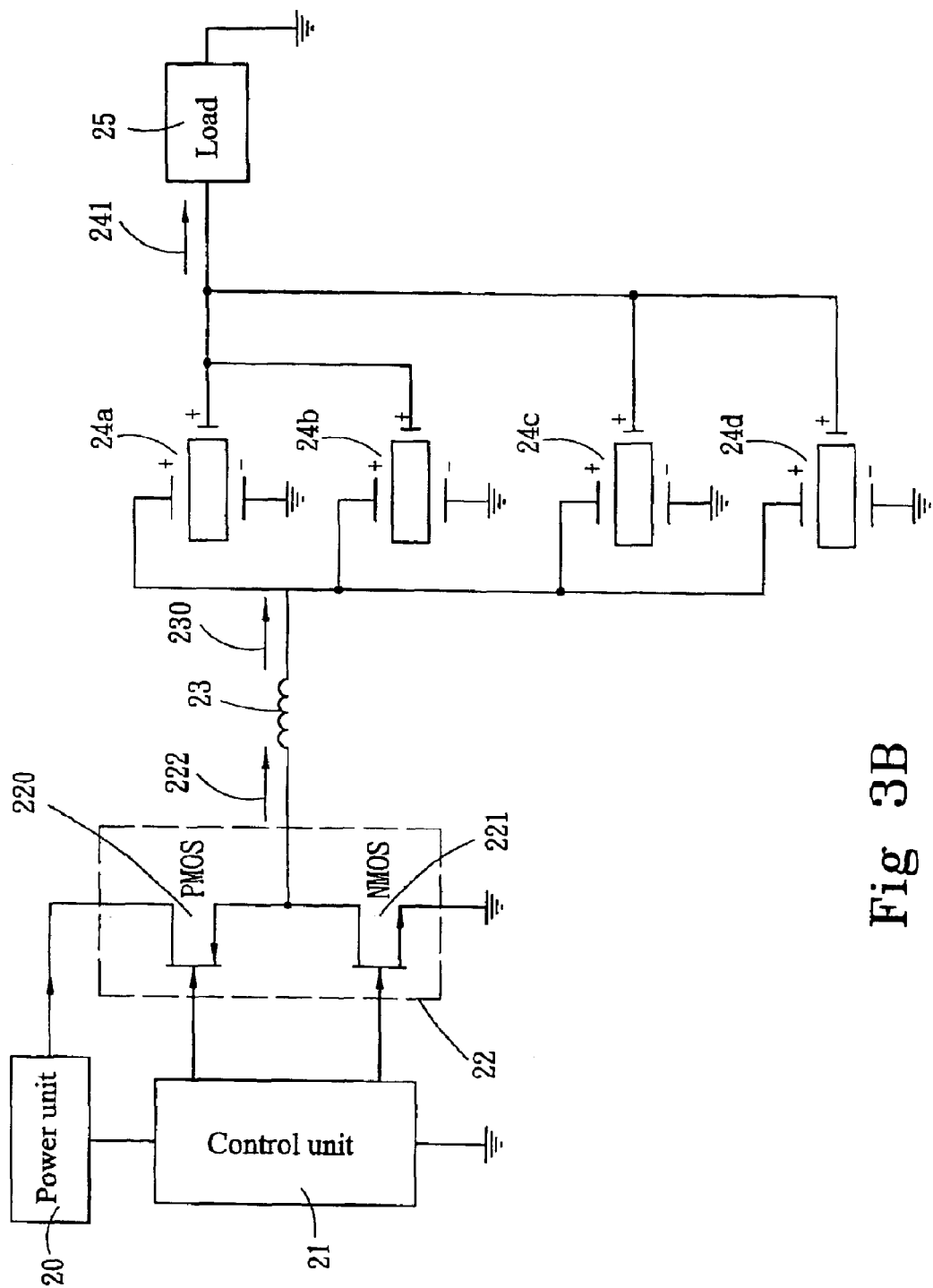
FIG. 3B is a second schematic view of the second embodiment of the invention.

Please refer to FIGS. 3A and 3B for a second embodiment of the invention. It is largely like the one previously discussed. The difference is that after the control unit 21 controls the driving unit 22, multiple piezoelectric units 24a, 24b, 24c and 24d synchronously drive a single load 25 to operate. Two piezoelectric units 24a and 24b are driven by the second driving signal 230 and transform to generate a positive phase driving signal 241 to drive the positive end of the load 25 (the positive polarity shown in FIG. 3A), while the negative end of the load 25 is driven by an inverted driving signal 242 transformed and generated by other two piezoelectric units 24c and 24d after having been driven by the second driving signal 230 output from the transformation unit 23 (the negative polarity shown in FIG. 3A). The positive phase driving signal 241 and the inverted driving signal 242 have a phase difference of 180°.

Moreover, after the piezoelectric units 24a, 24b, 24c and 24d are driven by the second driving signal 230 output from the transformation unit 23, transform to generate the positive phase driving signal 241 to drive the positive end of the single load 25 (the positive polarity shown in FIG. 3B), while the negative end of the load 25 is grounded.

Embodiment 3

Figure 4:
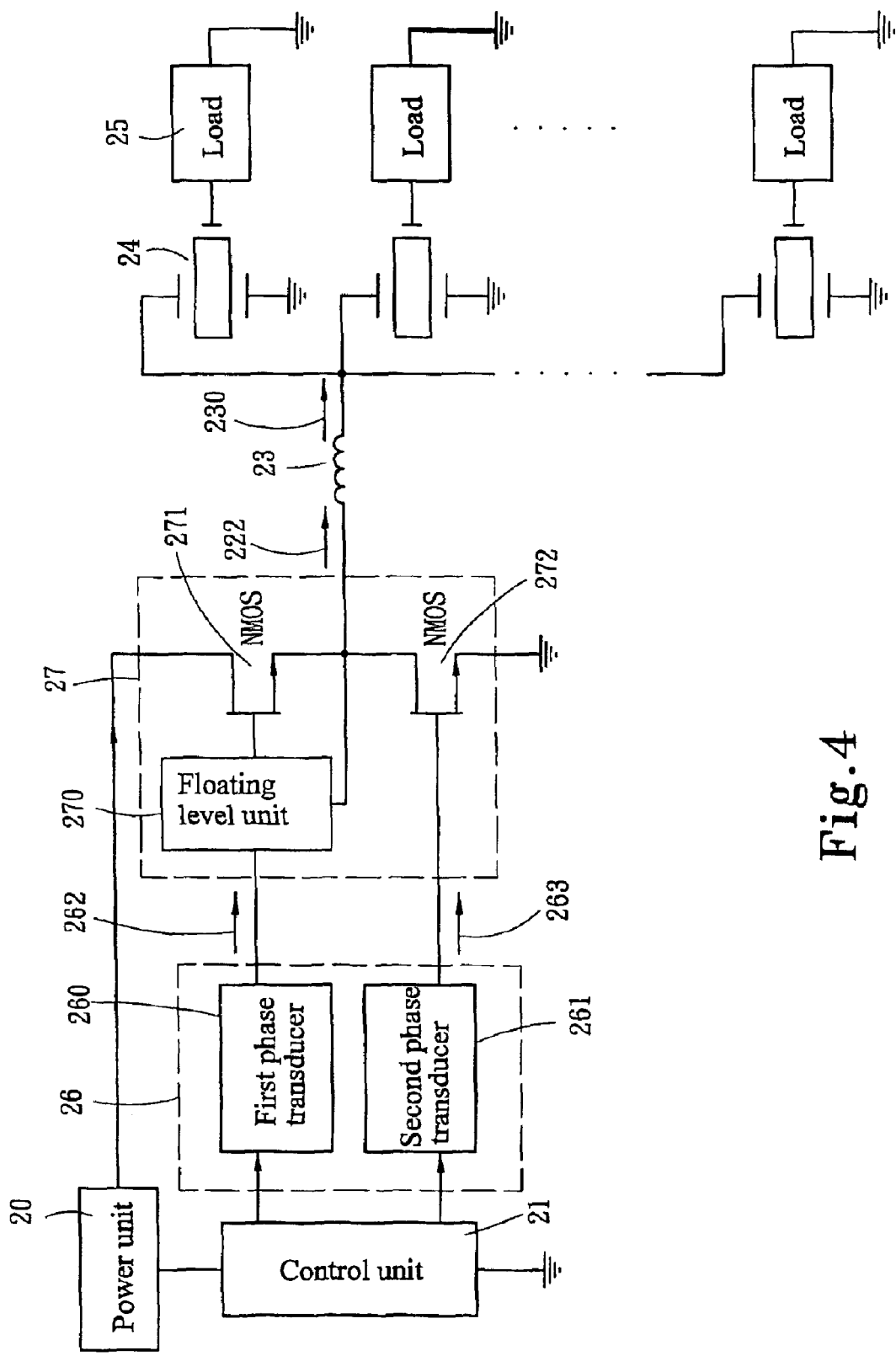
FIG. 4 is a schematic view of a third embodiment of the invention.

Refer to FIG. 4 for a third embodiment of the invention. In this embodiment a ceramic transformer level driving circuit is added to drive a transformation unit 23, a plurality of piezoelectric units 24 and loads 25. And a medium voltage system may be controlled through a low voltage level. The ceramic transformer level driving circuit includes:

a waveform transformation unit 26 to receive phase signals generated by the control unit 21. It includes a first phase transducer 260 and a second phase transducer 261 to provide waveform phase transformations of the phase signals to become a first phase signal 262 and a second phase signal 263; and a medium voltage driving circuit 27 which consists of a floating level unit 270 and two N-MOSFET 271 and 272. Actuation of the first N-MOSFET 271 is controlled by the transformed first phase signal 262, while actuation of the second N-MOSFET 272 is controlled by the transformed second phase signal 263. Moreover, the first and the second N-MOSFET 271 and 272 are actuated at different time to enable the floating level unit 270 to output a voltage floating level.

This embodiment includes the following features: a single control unit 21 is used to synchronously control a single transformation unit 23, a plurality of piezoelectric units 24 and a plurality of loads 25 through the voltage floating level. The first and second phase signals 262 and 263 are positive phase signals, and the first and second phase transducers 260,261 are respectively an inverter and a non-inverter; or the first and second phase signals 262 and 263 are respectively a positive phase signal and an inverted signal, and the first and second phase transducers 260 and 261 are two inverters; or the first and second phase signals 262 and 263 are two inverted signals, and the first and second phase transducers 260 and 261 are respectively a non-inverter and an inverter.

Embodiment 4

Figure 5A:
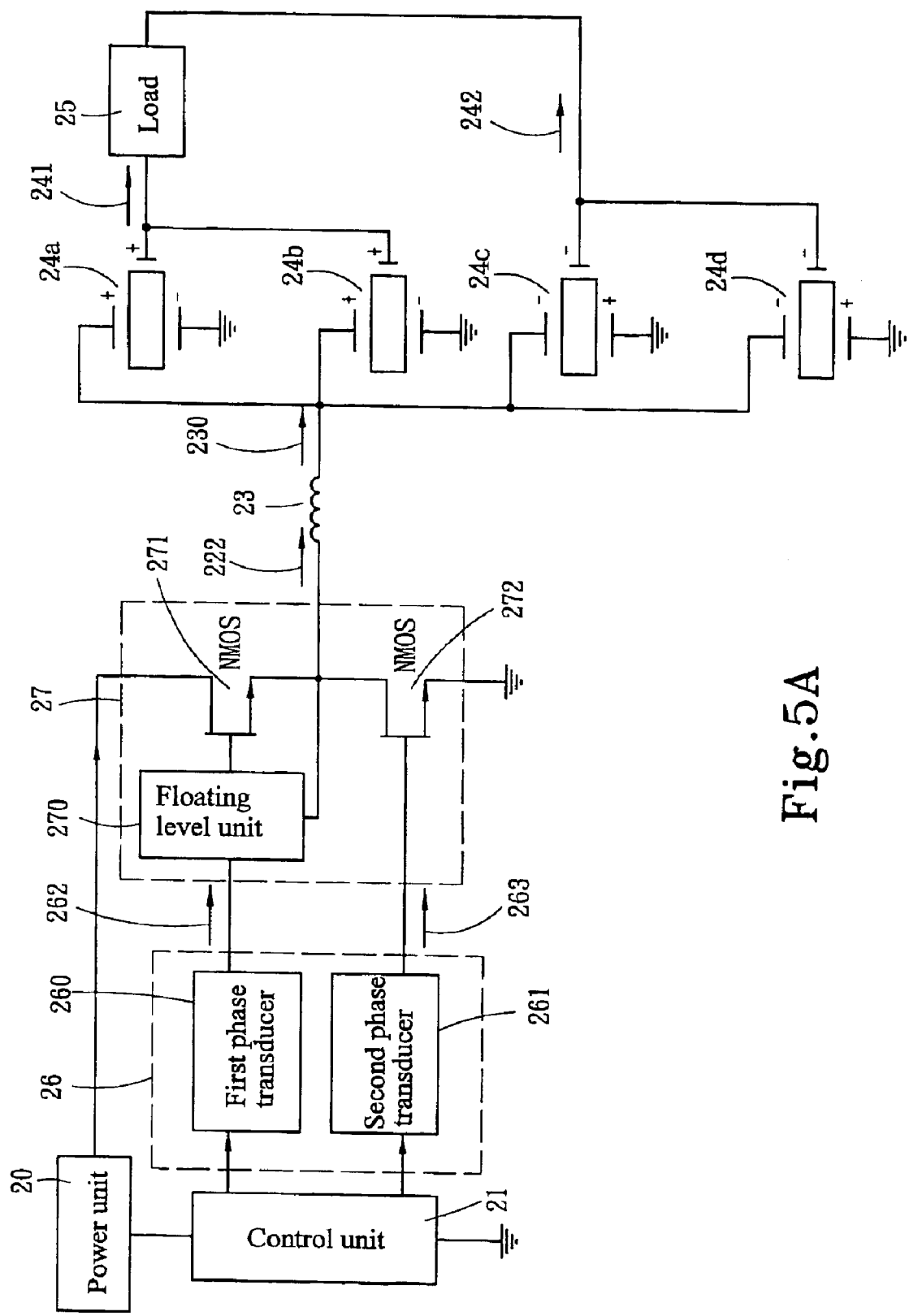
FIG 5A is a first schematic view of a fourth embodiment of the invention.
Figure 5B:
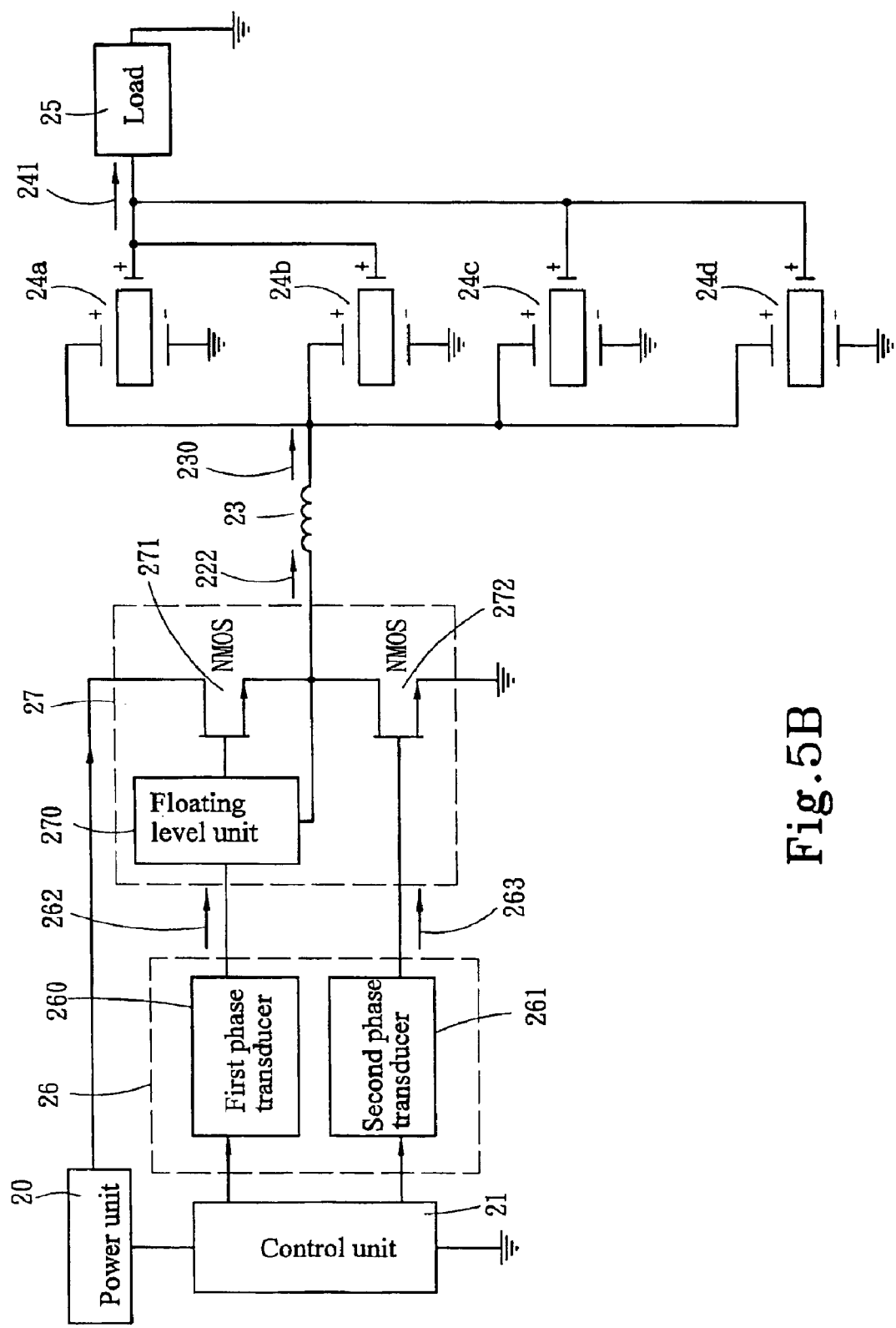
FIG. 5B is a second schematic view of the fourth embodiment of the invention.

Refer to FIGS. 5A and 5B for a fourth embodiment of the invention. It is largely like the one previously discussed. The difference is that after the control unit 21 controls the waveform transformation unit 26 and the medium voltage driving circuit 27, multiple piezoelectric units 24a, 24b, 24c and 24d synchronously drive a single load 25. Two piezoelectric units 24a and 24b are driven by the second driving signal 230 transformed and generated by the transformation unit 23 and transform to generate a positive phase driving signal 241 to drive the positive end of the single load 25 (the positive polarity shown in FIG. 5A), while the negative end of the load 25 is driven by an inverted driving signal 242 transformed and generated by other two piezoelectric units 24c and 24d after having been driven by the second driving signal 230 output from the transformation unit 23 (the negative polarity shown in FIG. 5A). The positive phase driving signal 241 and the inverted driving signal 242 have a phase difference of 180°.

Moreover, the piezoelectric units 24a, 24b, 24c and 24d are driven by the second driving signal 230 output from the transformation unit 23 and transform to generate the positive phase driving signal 241 to drive the positive end of the single load 25 (the positive polarity shown in FIG. 5B), while the negative end of the load 25 is grounded.

While the preferred embodiments of the invention have been set forth for the purpose of disclosure, modifications of the disclosed embodiments of the invention as well as other embodiments thereof may occur to those skilled in the art accordingly, the appended claims are intended to cover all embodiments which do not depart from the spirit and scope of the invention.

What is claimed is:

1. A piezoelectric transformation driving apparatus, comprising:

a control unit to receive a low voltage input and transmit a synchronous control signal;

a ceramic transformer level driving unit receiving the control signal from the control unit and processing to output a first driving signal, the ceramic transformer level driving circuit including:
- a waveform transformation unit to receive phase signals generated by the control unit having a first phase transducer and a second phase transducer to provide waveform phase transformation of the phase signals, and
- a medium voltage driving circuit comprising a floating level unit and a driving unit to receive medium voltage input, the driving unit comprising two N-MOSFET, actuation of the first N-MOSFET being controlled by a transformed first phase signal, and actuation of the second N-MOSFET being controlled by a transformed second phase signal, the first and the second the N-MOSFET being actuated at different time to allow the floating level unit to output a voltage floating level;

a transformation unit connected to the ceramic transformer level driving unit and driven by the first driving signal input from the ceramic transformer level driving unit to transform to become a second driving signal to be outputted;

a plurality of piezoelectric units connected to the transformation unit and driven by the second driving signal to transform through various polarization and polarity arrangements to become third driving signals of varying phases; and a plurality of loads connected to the piezoelectric units and driven by the third driving signals input from the piezoelectric units;

wherein the transformation unit synchronously drives the piezoelectric units and the loads, and the ceramic transformer level driving circuit drives the transformation unit, the piezoelectric units and the loads to control a medium voltage system through a low voltage level.

2. The piezoelectric transformation driving apparatus of claim 1, wherein the piezoelectric units driven by the second driving signal transforms to generate two synchronous positive phase driving signal and inverted driving signal to synchronously drive a single load, the positive phase driving signal driving the positive end of the load and the inverted driving signal driving the negative end of the load.

3. The piezoelectric transformation driving apparatus of claim 2, wherein the positive phase driving signal and the inverted driving signal have phase difference of 180°.

4. The piezoelectric transformation driving apparatus of claim 1, wherein the piezoelectric units driven by the second driving signal transforms and generates two synchronous positive phase driving signals to drive the positive end of a single load, the negative end of the load being grounded.

5. The piezoelectric transformation driving apparatus of claim 1, wherein the transformation unit is an inductor.

6. The piezoelectric transformation driving apparatus of claim 1, wherein the piezoelectric units are single layer piezoelectric ceramic transformers.

7. The piezoelectric transformation driving apparatus of claim 1, wherein the piezoelectric units are laminated piezoelectric ceramic transformers.

8. The piezoelectric transformation driving apparatus of claim 1, wherein the loads are cold cathode fluorescent lamps(CCFLs).

9. The piezoelectric transformation driving apparatus of claim 1, wherein the phase signals are two positive phase signal waveforms, the first and the second phase transducers are an inverter and a non-inverter.

10. The piezoelectric transformation driving apparatus of claim 1, wherein the phase signals are a positive phase signal and an inverted signal, the first and the second phase transducers are two inverters.

11. The piezoelectric transformation driving apparatus of claim 1, wherein the phase signals are two inverted signals, the first and the second phase transducers are a non-inverter and an inverter.

* * * * *